United States Patent

Merchant et al.

[11] Patent Number: 6,157,082
[45] Date of Patent: Dec. 5, 2000

[54] SEMICONDUCTOR DEVICE HAVING ALUMINUM CONTACTS OR VIAS AND METHOD OF MANUFACTURE THEREFOR

[75] Inventors: Sailesh M. Merchant; Binh Nguyenphu, both of Orlando, Fla.

[73] Assignee: Lucent Technologies Inc., Murray Hill, N.J.

[21] Appl. No.: 09/166,832

[22] Filed: Oct. 5, 1998

Related U.S. Application Data

[62] Division of application No. 08/820,063, Mar. 18, 1997.

[51] Int. Cl.[7] .......................... H01L 23/48; H01L 23/52; H01L 29/40
[52] U.S. Cl. .......................... 257/758; 257/759; 257/760; 257/761; 257/765; 257/774
[58] Field of Search ................................ 257/761, 765, 257/763, 771, 774, 758, 759, 760

[56] References Cited

U.S. PATENT DOCUMENTS

| | | | |
|---|---|---|---|
| 4,275,715 | 6/1981 | van de Ven et al. ...................... | 29/590 |
| 4,433,004 | 2/1984 | Yonezawa et al. ........................ | 427/38 |
| 4,870,033 | 9/1989 | Hotta, et al. ............................. | 437/192 |
| 4,896,204 | 1/1990 | Hirata et al. ............................. | 357/67 |
| 4,965,656 | 10/1990 | Koubuchi et al. ........................ | 357/71 |
| 5,108,951 | 4/1992 | Chen et al. ............................... | 437/187 |
| 5,162,262 | 11/1992 | Ajika et al. .............................. | 437/200 |
| 5,275,715 | 1/1994 | Tuttle ...................................... | 205/123 |
| 5,332,693 | 7/1994 | Kim ........................................ | 437/194 |
| 5,374,592 | 12/1994 | MacNaughton et al. ................ | 437/194 |
| 5,434,104 | 7/1995 | Cain et al. ................................ | 437/198 |
| 5,489,552 | 2/1996 | Merchan et al. ........................ | 437/192 |
| 5,534,463 | 7/1996 | Lee et al. ................................. | 437/195 |
| 5,563,099 | 10/1996 | Grass ....................................... | 437/192 |
| 5,572,072 | 11/1996 | Lee .......................................... | 257/751 |
| 5,635,763 | 6/1997 | Inoue et al. .............................. | 257/763 |
| 5,668,055 | 9/1997 | Xu et al. .................................. | 438/637 |

FOREIGN PATENT DOCUMENTS

| | | | |
|---|---|---|---|
| 0 042 926 | 1/1982 | European Pat. Off. ......... | H01L 21/90 |
| 0 310 108 A2 | 4/1989 | European Pat. Off. ......... | H01L 21/74 |
| 0 310 108 A3 | 4/1989 | European Pat. Off. ......... | H01L 21/90 |

OTHER PUBLICATIONS

Publication dated Jun. 15, 1992 by American Institute of Physics entitled "Roles of Ti–intermetallic compound layers on the electromigration resistance of Al–Cu interconnecting stripes" by C.C. Lee of Motorola, Inc.

F.K. LeGoues, M. Wittmer, T, Kwok, H. –C. W. Huang and P. S. Ho; "THE MICROSTRUCTURE OF TRANSITION METAL/AL(Cu) LAYERS"; Apr. 1987; pp. 940–944.

C. –C. Lee, E. S. Machlin. H. RAthore; "ROLES OF TI–INTERMETALLIC COMPOUND LAYERS ON THE ELECTROMIGRATION RESISTANCE OF AL–CU INTERCONNECTING STRIPES"; J. Appl. Phys. 71 (12), 15 Jun. 1992; pp. 5877–5877.

*Primary Examiner*—David Hardy
*Assistant Examiner*—Jesse A. Fenty

[57] ABSTRACT

A semiconductor device and a method of manufacture therefor. The semiconductor device includes: (1) a substrate having a recess therein, (2) an aluminum-alloy layer located over at least a portion of the substrate and filling at least a portion of the recess and (3) a protective metal layer at least partially diffused in the aluminum-alloy layer, the metal protective layer having a high affinity for oxygen and acting as a sacrificial target for oxygen during a reflow of the aluminum-alloy layer.

18 Claims, 2 Drawing Sheets

SEMICONDUCTOR DEVICE HAVING ALUMINUM CONTACTS OR VIAS AND METHOD OF MANUFACTURE THEREFOR

This Application is a Divisional of prior application Ser. No. 08/820,063 filed on Mar. 18, 1997, currently pending, to Sailesh M. Merchant, et al. The above-listed Application is commonly assigned with the present invention and is incorporated herein by reference as if reproduced herein in its entirety under Rule 1.53(b).

TECHNICAL FIELD OF THE INVENTION

The present invention is directed, in general, to semiconductors and fabrication techniques and, more specifically, to a semiconductor device having a conductive layer with a metal protective layer at least partially diffused into the conductive layer and a method of manufacture therefor.

BACKGROUND OF THE INVENTION

In semiconductor integrated circuits, the formation of metal interconnect layers is important to the proper operation of such devices. Metal interconnect signal lines make contact to lower conductive layers of the integrated circuit through vias or through contact windows to "active" device regions of the semiconductor in an insulating layer. For best operation of the device, the metal used to form the interconnect layer should completely fill the via or contact window (hereinafter referred to as opening(s)).

Because of their physical properties, aluminum-alloys (e.g., aluminum-copper, aluminum-silicon, aluminum-copper-silicon) are especially suited for fabrication of metal interconnect lines in integrated circuits. However, the sputtering process used to apply aluminum-alloy thin film layers to an integrated circuit generally results in less than ideal filling of openings. Since the aluminum-alloy is deposited at an elevated temperature to obtain large grains for improved electromigration reliability, these large aluminum-alloy grains tend to form on the upper surface of the insulating layer. The grains that form at the edges of the opening tend to block the opening before the aluminum-alloy has a chance to completely fill it. This results in voids and uneven structures within the via.

This problem is especially acute as integrated circuit devices are fabricated using smaller geometries. The smaller openings used in these devices tend to have a larger aspect ratio (opening height is to width ratio) than larger geometry devices, which exacerbates the aluminum-alloy filling problem.

The uneven thickness of the aluminum-alloy layer going into the opening has an adverse impact on device functionality. If the voids in the opening(s) are large enough, contact resistance can be significantly higher than desired. In addition, the thinner regions of the aluminum-alloy layer will be subject to the well known electromigration problem. This can cause eventual open circuits at the contacts and failure of the device.

To solve the problems associated with sputtering techniques, many approaches have been used to ensure good metal contact to lower interconnect levels. For example, one technique involves depositing the aluminum-alloy interconnect by sputtering in a physical vapor deposition tool ("PVD") and then reflowing it in a separate reflow module at temperatures that range between 500° C. to 575° C. At these temperatures, the surface mobility and diffusion kinetics of the aluminum-alloy are enhanced, allowing it to deposit into the openings and fill them. However, at these high temperatures, the reflow module is very sensitive to impurities. As is well known, aluminum-alloy easily oxidizes and any presence of oxygen or moisture in the tool, particularly while processing in the reflow module will negate the reflow process. In other words, the aluminum-alloy will not reflow and properly fill the opening if the aluminum-alloy oxidizes or moisture forms on it. Thus, the deposition, transfer and subsequent reflow is carried out in an ultra high vacuum environment, preferably in a multi-chamber cluster tool having very low partial pressures of water vapor and oxygen.

These environmental conditions require extensive preconditioning times, such as tool chamber pump-down and bakes, to bring the modules up to the required pristine operating conditions. Further, metal vacuum seals must be used instead of conventional "O"-ring seals to reduce module pump-down times. These metal seals must be used in the transfer chamber as well as in the deposition and reflow chambers. Consequently, these pre-conditioning steps increase the overall cost of the machine and the production time, which also increase the overall cost of the semiconductor devices.

Accordingly, what is needed in the art is a semiconductor device and a method of manufacture therefor such that the conductive layers connecting the openings are subject to not subject to substantial oxidation during the manufacturing process. The semiconductor and method of the present invention addresses these needs.

SUMMARY OF THE INVENTION

To address the above-discussed deficiencies of the prior art, the present invention provides a semiconductor device and a method of manufacture therefor. The semiconductor device includes: (1) a substrate having a recess therein, (2) a conductive layer located over at least a portion of the substrate and filling at least a portion of the recess and (3) a metal protective layer at least partially diffused in the conductive layer. In an advantageous embodiment, the metal protective layer has a higher affinity for oxygen than the conductive layer and thereby acts as a sacrificial "getter" of oxygen from the conductive layer during a reflow of the conductive layer to reduce oxidation in the conductive layer. In another embodiment, the metal protective layer acts as an oxygen getter from the processing tool, and in yet another embodiment, the alloying element in the metal protective layer acts as an oxygen getter.

The present invention thereby introduces the broad concept of reducing or eliminating the oxidation that occurs in the conductive layer by providing a barrier or cap, in the form of at least a partially oxidized metal layer that traps oxygen before it reaches the conductive layer or removes it from the conductive layer, or in other embodiments, removes it from the conductive layer in the event that the conductive layer oxidizes prior to deposition of the metal protective layer. The present invention therefore allows a conductive plug to be formed reliably without requiring the exotic low pressure environment of the prior art.

In one embodiment of the present invention, the substrate comprises silicon and the conductive layer may be aluminum, aluminum-alloy or other conventional or later-discovered conductive metals used for forming a circuit pattern on the semiconductor device. Alternatively, the substrate may be gallium arsenide or any other conventional or later-discovered substrate suitable for providing a foundation for a solid state device.

In one preferred embodiment of the semiconductor device, the metal protective layer decreases the rate of electromigration is damage accumulation in the conductive layer when it partially diffuses into the conductive layer.

In an alternative embodiment of the present invention, the aluminum or aluminum-alloy layer fills at least the portion of the recess and forms a contact for the semiconductor device. The recess thus may be a via that provides inter-layer connectivity in a multi-layer substrate or a contact for a terminal (such as a source, gate, drain, base, emitter or collector) of a semiconductor device.

In one embodiment of the present invention, the metal protective layer is selected from the group consisting of: (1) magnesium, (2) yttrium, (3) hafnium, (4) cerium, (5) scandium and (6) zirconium. Those skilled in the art are familiar with other metals that may be advantageous, depending upon the application. In another embodiment, the metal protective layer is selected from a group of metals consisting of (1) titanium or (2) vanadium, and in yet another embodiment, the metal protective layer is selected from a group of aluminum-alloys containing any of the aforementioned metals as solute. In such an embodiment, the metal protective layer is alloyed with the aluminum or aluminum-alloy conductive layer. Each of these inventions is discussed in detail below. Those skilled in the art are familiar with other metals and alloys that may be advantageous, depending on the application.

In another embodiment of the present invention, the metal protective layer is selected from a group of metals that are able to at least partially reduce any oxide on the conductive layer. Moreover, the elements of the metal protective layer may be at least partially diffused into the conductive layer without substantially altering the intended purposes of the conductive layer. Furthermore, the metal protective layer may be fully sacrificed during the reflow process, or alternatively, some of the original metal protective layer may remain intact.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
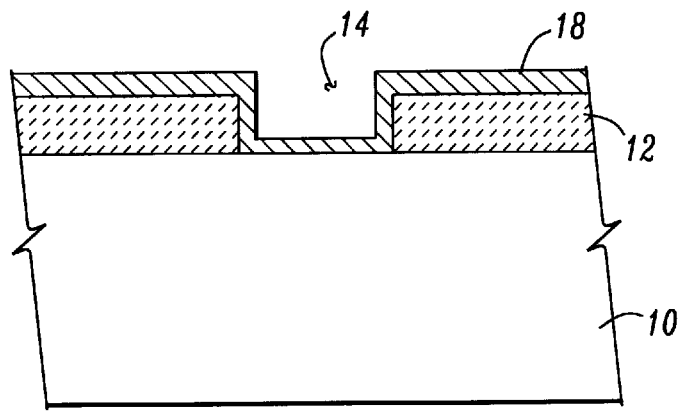
FIG. 1 illustrates a cross-sectional view of a semiconductor device that has a contact window or via formed therein.

Referring initially to FIG. 1, an integrated circuit device is formed on a semiconductor substrate 10, which may be comprised of materials known to those skilled in the art such as silicon or gallium arsenide. Although a substrate 10 is described, it will be apparent to those skilled in the art that the described technique may be used with a contact formed to any underlying conductive layer. Thus, the substrate 10 may include multiple layers of polycrystalline silicon or metallic interconnect, as well as being an active region in a monocrystalline silicon substrate.

An insulating layer 12 that has a thickness, which varies from device to device, depending on the application, such as a silicon oxide ($SiO_2$), is formed over the substrate 10, and an opening 14 (via or contact window) is formed therethrough using a mask and an isotropic etching technique as known in the art.

Figure 2:
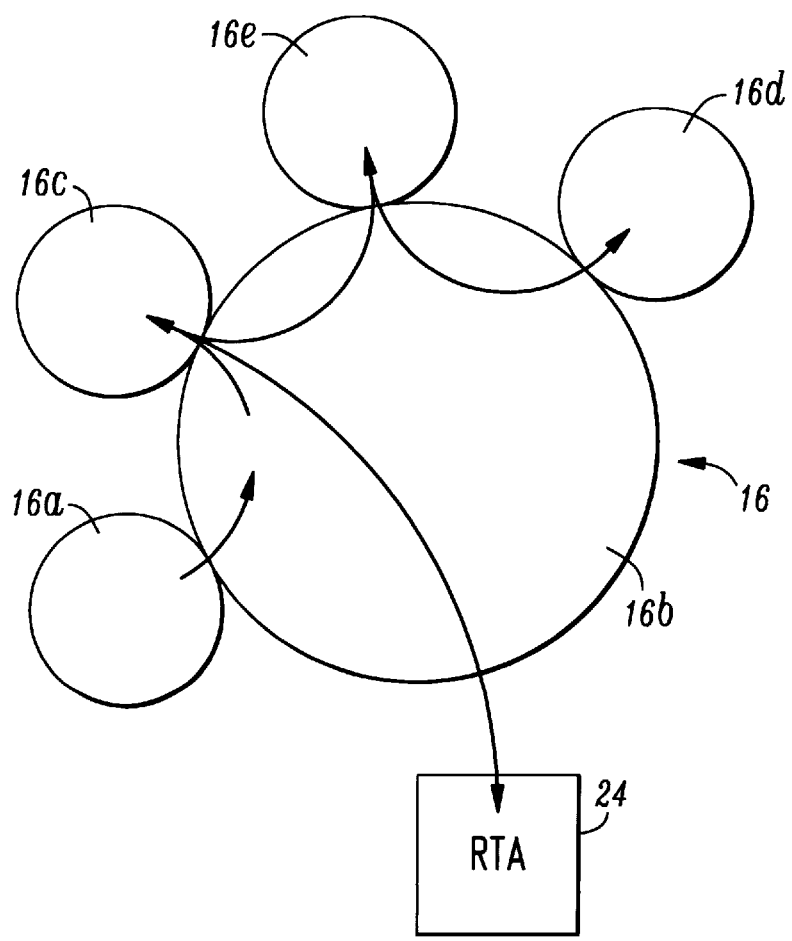
FIG. 2 illustrates a schematic diagram of a conventional physical vapor deposition tool with the various deposition chambers therein.

The semiconductor device is placed in a conventional deposition tool 16, such as a physical vapor deposition tool ("PVD") schematically illustrated in FIG. 2, or a chemical vapor deposition tool, not shown. A barrier layer 18, such as a refractory metal, refractory metal nitride, refractory metal silicide, or combination thereof, is uniformly deposited over the insulating layer 12 and in the opening 14 using conventional deposition techniques. The barrier layer 18 is preferably deposited to a thickness of approximately 20 nm to 200 nm and is preferably comprised of titanium and titanium nitride. A "wetting layer" to improve the aluminum-alloy deposition characteristics may also be included as part of barrier layer 18. Because of the innate advantages associated with the present invention as discussed herein, the deposition tool 16 is preferably of conventional design. As such, the deposition tool 16 preferably has a deposition chamber 16a in which the barrier layer 18, is formed a deposition chamber 16c in which the conductive layer 20 is deposited, a transfer chamber 16b through which the semiconductor device is transferred from one chamber to another, a chamber 16e and a reflow chamber 16d. The metal protective layer 22 (FIG. 3) is subsequently deposited in chamber 16e and the substrate 10 is heated in a reflow chamber 16d in which the conductive layer 20 is reflowed after deposition. However, it should be understood that in some embodiments, all depositions steps may be conducted in a single chamber. Alternatively, the semiconductor device may be transferred to a rapid thermal anneal ("RTA") device 24 as schematically illustrated in FIG. 2. Because the PVD tool 16 is of conventional design, special metallic seals and preparation techniques for the PVD tool, which are required by conventional processes to maintain extremely low vacuums, are not necessary.

Figure 3:
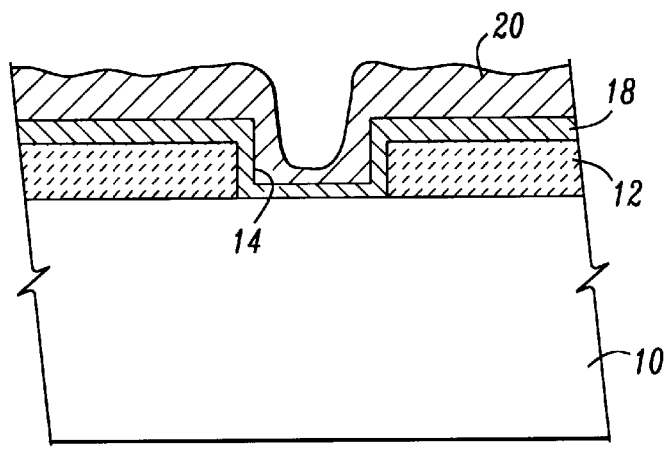
FIG. 3 illustrates a cross-sectional view of the semiconductor device of FIG. 1 with a conductive layer partially deposited in the via.
Figure 4:
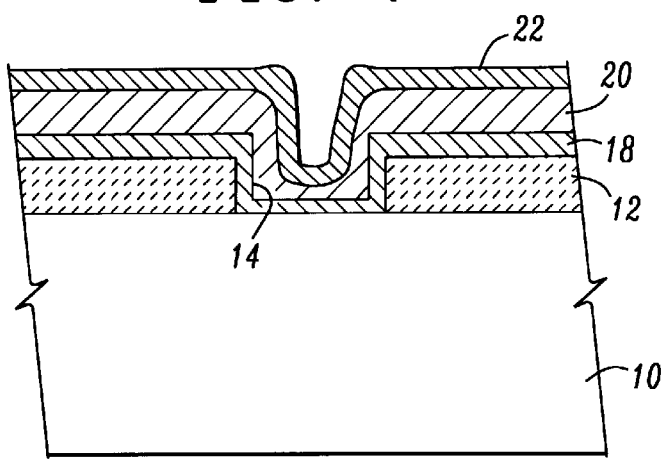
FIG. 4 illustrates a cross-sectional view of the semiconductor device of FIG. 3 with a metal protective layer deposited over the conductive layer prior to its diffusion in the conductive layer.

Turning now to FIG. 3, the semiconductor device with a conductive layer 20 deposited thereon is illustrated. The deposition of the conductive layer 20 is conducted in the PVD tool 16, and is deposited over the substrate 10 and the barrier layer 18 using conventional PVD techniques at a pressure of ranging from about 1 milliTorr to about 10 milliTorr and temperatures that ranges from about 25° C. to about 400° C. In preferred embodiments, the thickness of the conductive layer ranges from about 400 nm to about 700 nm. The conductive layer 20 is susceptible to oxidation and may be comprised of any type of such conductive material, such as aluminum or aluminum-alloy, known to those skilled in the art. The purpose and function of the conductive layer 20 is well known in the art and serves as an interconnect layer that electrically connects devices on the semiconductor device. The conductive layer 20 is not a barrier layer, such as titanium nitride. For reasons previously discussed with respect to conventional processes, the conductive layer 20 is not uniformly deposited within the opening 14 and must, therefore, be reflowed so that the it can uniformly fill and contact the sides of the opening 14 to form a reliable contact point for the integrated circuit device.

Upon deposition of the barrier layer 12 and the conductive layer 20, the metal protective layer 22, as illustrated in FIG.

4, is deposited over the conductive layer 20. In a preferred embodiment, the metal layer 22 is deposited using conventional PVD techniques under a pressure that ranges from about 2 milliTorr to about 10 milliTorr and a temperature that ranges from about 25° C. to about 400° C. and deposition is conducted to achieve a metal layer that has a thickness that ranges from about 5 nm to about 20 nm It should be particularly noted that the pressure at which the semiconductor device is fabricated is substantially higher than the $10^{-8}$ torr associated with conventional techniques. Thus, the special metal seals and time consuming preparation steps for the PVD tool are not required in the present invention.

In another embodiment, the metal protective layer 22 preferably has an affinity for oxygen that is higher than that of the conductive layer 20 and acts as a sacrificial target for the oxygen during the reflow of the conductive layer 20. In other words, it is believed that the metal protective layer 22 readily combines with oxygen that is present in the conductive layer 20 and effectively pulls a substantial portion of the oxygen from the conductive layer 20, and thus, substantially prevents the oxygen from oxidizing the conductive layer 20. As such it functions as a "cap" to protect and substantially inhibit oxidation of the underlying conductive layer 20. As previously discussed above, oxidation of the conductive layer 20 is undesirable because it substantially inhibits the conductive layer 20 from uniformly flowing into the opening 14 during the reflow process and making proper contact with the interior side walls of the opening 14, which can result in a defective integrated circuit device. Furthermore, another possible advantage of the metal protective layer 22 is that it may remove a substantial portion of any oxygen from the conductive layer 20 that may have formed on the conductive layer 20 prior to the formation of the metal protective layer 22. In a preferred embodiment, the metal protective layer 22 is comprised of a metal selected from the group consisting of magnesium, yttrium, hafnium, cerium, scandium and zirconium.

In another embodiment, the metal protective layer 22 preferably has a high affinity for oxygen and acts as a sacrificial target for the oxygen during the reflow of the conductive layer 20. It is believed that in this embodiment the metal protective layer 22 readily combines with oxygen that is present in the environment surrounding the conductive layer 20 and effectively pulls a substantial portion of the oxygen from the environment, and thus, substantially prevents the oxygen from oxidizing the conductive layer 20. As such it functions as an oxygen getter to protect and substantially inhibit oxidation of the underlying conductive layer 20. In a preferred embodiment, the metal protective layer 22 is comprised of a metal selected from the group consisting of titanium and vanadium.

In yet another embodiment, the metal layer 22 may be capable of getting the oxygen from either the environment or for the conductive layer 20. In such embodiments, the metal protective layer 22 is comprised of a metal selected from the group consisting of a combination of metals previously discussed above and alloyed with aluminum alloys such as aluminum-copper, aluminum-silicon, or aluminum-copper-silicon. For example, the metal protective layer 22 may be comprised of either titanium or vanadium or magnesium, yttrium, hafnium, cerium, scandium and zirconium, which may be alloyed with an aluminum alloy.

Figure 5:
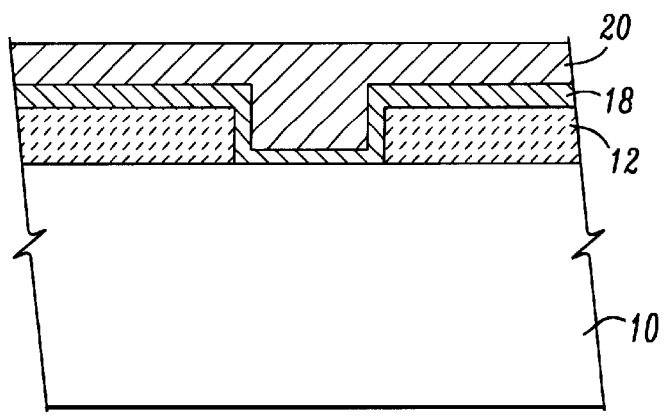
FIG. 5 illustrates a cross-sectional view of the semiconductor device of FIG. 4 after the device has been subjected to a reflow process, where the metal layer has been oxidized and diffused into the conductive layer.

After deposition of the metal layer 22, the semiconductor device is then transferred to either a reflow chamber 16d or a rapid thermal anneal device 24 to be subjected to temperatures ranging between 350° C. to 550° C., which are sufficient to reflow the conductive layer 20 such that it uniformly fills the opening 14. As previously stated, the deposition tool may be of such a design that has only one chamber in which all phases of the deposition and annealing may be conducted. After deposition and during the reflow process, it is believed that the metal layer 22 oxidizes and forms an oxidized metal that at least partially diffuses into the conductive layer 20 (FIG. 5). In such instances, research has shown that diffusion of titanium into aluminum-alloy acts to decrease the rate of electromigration damage accumulation in an aluminum-alloy-copper conductive layer as discussed in the article entitled "Roles of Ti-intermetallic compound layers on the electromigration resistance of Al—Cu interconnecting stripes", J. Appl. Phys. 71, June 1992, pages 5877–5887, which is incorporated herein by reference. In some embodiments, the metal layer 22 may completely diffuse into the conductive layer 20 or remain substantially on top of the conductive layer 20. In either embodiment, however, the metal layer 22 serves as a target to which oxygen may bond, thereby preventing substantial oxidation of the conductive layer 20 such that it reflows uniformly into the opening 14 and forms a reliable electrical contact point within the integrated circuit.

From the foregoing it is apparent that the present invention provides a semiconductor device that includes: (1) a substrate having a recess therein, (2) a conductive layer located over at least a portion of the substrate and filling at least a portion of the recess and (3) a metal protective layer at least partially diffused in the conductive layer. The metal has a higher affinity for oxygen than the conductive layer and thereby acts as a sacrificial target for oxygen during a reflow of the conductive layer to reduce oxidation in the conductive layer.

The present invention thereby introduces the broad concept of reducing the oxidation that occurs in the conductive layer by providing a barrier or cap, in the form of the oxidized metal, that traps oxygen before it reaches the conductive layer or removes it from the conductive layer in the event that the conductive layer partially oxidizes prior to deposition of the protective oxidizable metal layer. The present invention therefore allows a conductive plug to be formed reliably without requiring the exotic low pressure environment of the prior art.

The foregoing has outlined, rather broadly, preferred and alternative features of the present invention. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A semiconductor device, comprising:
   a substrate having a recess therein;
   a conductive layer located over at least a portion of said substrate and filling at least a portion of said recess to form a plug within said recess, said conductive layer susceptible to oxidation; and
   a metal protective layer at least partially oxidized and diffused in said conductive layer, said metal protective layer having a high affinity for oxygen.

2. The semiconductor device as recited in claim 1 wherein said substrate comprises silicon.

3. The semiconductor device as recited in claim 1 wherein said metal protective layer decreases the rate of electromigration damage accumulation in said conductive layer.

4. The semiconductor device as recited in claim 1 wherein said meta, protective layer comprises a metal selected from the group consisting of:
   titanium,
   vanadium,
   magnesium,
   yttrium,
   hafnium,
   cerium,
   scandium, and
   zirconium,
   and said oxidized metal is alloyed with an aluminum alloy.

5. The semiconductor device as recited in claim 4 wherein said metal is selected from the group consisting of:
   titanium and
   vanadium.

6. The semiconductor device as recited in claim 4 wherein said metal is selected from the group consisting of:
   magnesium,
   yttrium,
   hafnium,
   cerium,
   scandium, and
   zirconium.

7. The semiconductor device as recited in claim 1 wherein said metal protective layer is substantially oxidized by oxygen and diffused in said conductive layer.

8. The semiconductor device as recited in claim 1 wherein said conductive layer is an aluminum-alloy layer.

9. The semiconductor device as recited in claim 1 wherein said conductive layer fills at least said portion of said recess and forms a contact for said semiconductor device.

10. A semiconductor device, comprising:
    a dielectric substrate having a recess therein;
    a conductive layer located over at least a portion of said dielectric substrate and filling at least a portion of said recess to form a plug within said recess, said conductive layer susceptible to oxidation, and said plug in contact with either a gate, source or drain of said semiconductor device; and
    an oxygen-containing metal protective layer contacting and overlaying said conductive layer, said oxygen-containing metal layer having a higher affinity for oxygen than said conductive layer.

11. The semiconductor device as recited in claim 10 wherein said dielectric substrate comprises silicon dioxide.

12. The semiconductor device as recited in claim 10 wherein said metal protective layer decreases the rate of electromigration damage accumulation in said conductive layer.

13. The semiconductor device as recited in claim 10 wherein said oxygen-containing metal protective layer is comprised of a metal selected from the group consisting of:
    titanium,
    vanadium,
    magnesium,
    yttrium,
    hafnium,
    cerium,
    scandium, and
    zirconium,
    and is alloyed with an aluminum alloy.

14. The semiconductor device as recited in claim 10 wherein said metal layer is comprised of a metal selected from the group consisting of:
    titanium and
    vanadium.

15. The semiconductor device as recited in claim 10 wherein said metal layer is comprised of a metal selected from the group a consisting of:
    magnesium,
    yttrium,
    hafnium,
    cerium,
    scandium, and
    zirconium.

16. The semiconductor device as recited in claim 10 wherein said oxygen-containing metal protective layer is substantially diffused in said conductive layer.

17. The semiconductor device as recited in claim 10 wherein said conductive layer is an aluminum-alloy layer.

18. The semiconductor device as recited in claim 10 wherein said conductive layer fills at least said portion of said recess and forms a contact for said semiconductor device.

* * * * *